(12) United States Patent
Yamazaki et al.

(10) Patent No.: US 11,744,109 B2
(45) Date of Patent: Aug. 29, 2023

(54) DISPLAY DEVICE AND ELECTRONIC APPARATUS

(71) Applicants: SONY SEMICONDUCTOR SOLUTIONS CORPORATION, Kanagawa (JP); SONY CORPORATION, Tokyo (JP)

(72) Inventors: Takashi Yamazaki, Tokyo (JP); Kazuhiro Tamura, Kanagawa (JP)

(73) Assignees: SONY SEMICONDUCTOR SOLUTIONS CORPORATION, Kanagawa (JP); SONY CORPORATION, Tokyo (JP)

( * ) Notice: Subject to any disclaimer, the term of this patent is extended or adjusted under 35 U.S.C. 154(b) by 0 days.

(21) Appl. No.: 17/274,348

(22) PCT Filed: Sep. 3, 2019

(86) PCT No.: PCT/JP2019/034549
§ 371 (c)(1),
(2) Date: Mar. 8, 2021

(87) PCT Pub. No.: WO2020/059479
PCT Pub. Date: Mar. 26, 2020

(65) Prior Publication Data
US 2021/0327985 A1    Oct. 21, 2021

(30) Foreign Application Priority Data
Sep. 18, 2018    (JP) .................. 2018-173766

(51) Int. Cl.
*H10K 59/121*    (2023.01)
*G09G 3/3233*    (2016.01)
(Continued)

(52) U.S. Cl.
CPC ....... *H10K 59/1213* (2023.02); *G09G 3/3233* (2013.01); *H01L 21/28518* (2013.01);
(Continued)

(58) Field of Classification Search
CPC combination set(s) only.
See application file for complete search history.

(56) References Cited

U.S. PATENT DOCUMENTS 5,563,427 A    10/1996    Yudasaka et al.
5,576,556 A    11/1996    Takemura et al.
(Continued)

FOREIGN PATENT DOCUMENTS

CN    103810967 A    5/2014
EP      635890 A1    1/1995
(Continued)

OTHER PUBLICATIONS

International Search Report and Written Opinion of PCT Application No. PCT/JP2019/034549, dated Oct. 15, 2019, 09 pages of ISRWO.

*Primary Examiner* — Shaheda A Abdin
(74) *Attorney, Agent, or Firm* — Chip Law Group

(57) ABSTRACT

A display device includes a light-emitting portion and a drive circuit. The drive circuit includes a transistor that drives the light-emitting portion and includes a first diffusion layer and a first contact electrode, the first diffusion layer including no silicide formed in a silicon region, the first contact electrode being electrically connected to the first diffusion layer.

9 Claims, 12 Drawing Sheets

(51) Int. Cl.
*H01L 21/285* (2006.01)
*H01L 29/45* (2006.01)
*H10K 71/00* (2023.01)
*H10K 59/12* (2023.01)

(52) U.S. Cl.
CPC ........... *H01L 29/456* (2013.01); *H10K 71/00* (2023.02); *G09G 2320/0233* (2013.01); *G09G 2320/0238* (2013.01); *H10K 59/1201* (2023.02)

(56) References Cited

U.S. PATENT DOCUMENTS

| | | | |
|---|---|---|---|
| 2002/0098652 | A1 | 7/2002 | Mori et al. |
| 2012/0091518 | A1* | 4/2012 | Sukekawa ............ H10B 12/488 257/296 |
| 2014/0132175 | A1* | 5/2014 | Hokazono ........... H01L 27/3262 315/240 |

FOREIGN PATENT DOCUMENTS

| | | | |
|---|---|---|---|
| JP | 7-111334 | A | 4/1995 |
| JP | 2000-243926 | A | 9/2000 |
| JP | 2008-198679 | A | 8/2008 |
| JP | 2013-044890 | A | 3/2013 |
| JP | 2014-098779 | A | 5/2014 |
| KR | 10-1995-7001142 | A | 2/1995 |
| WO | 94/18706 | A1 | 8/1994 |

* cited by examiner

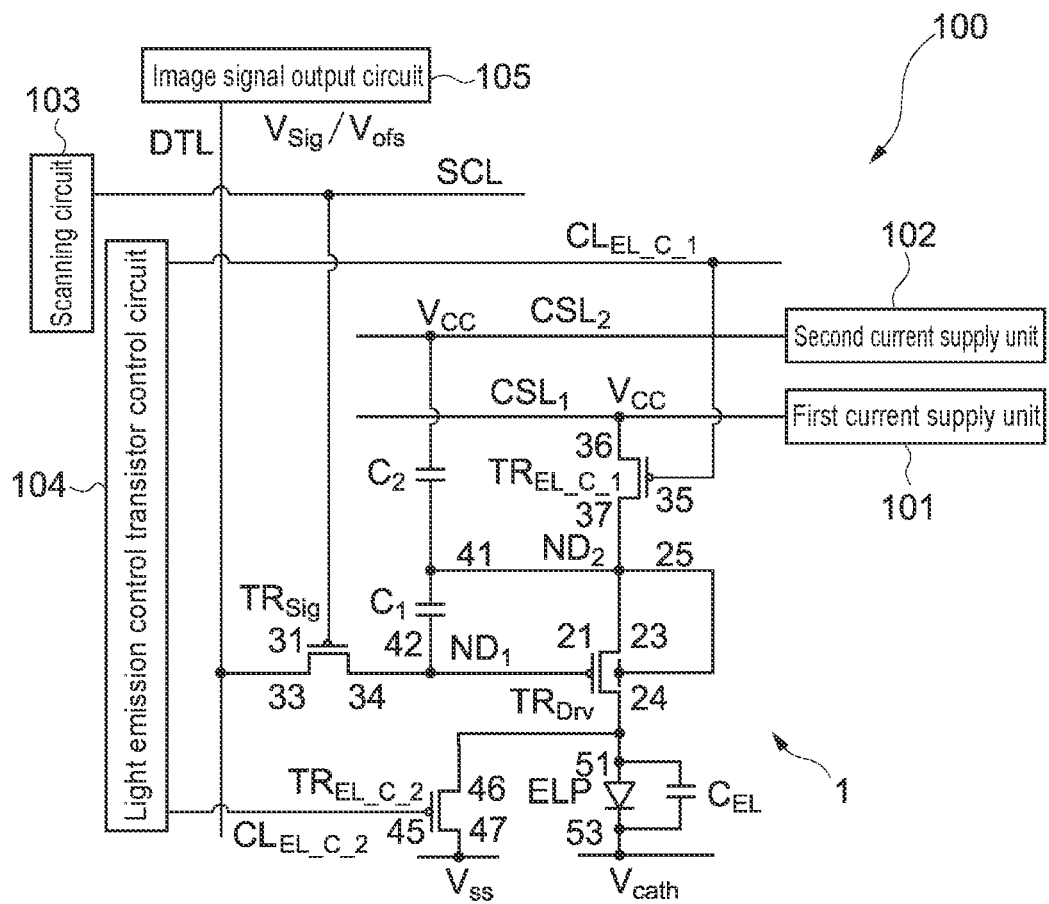

| | |
|---|---|
| $TR_{Sig}$ | : Image signal writing transistor |
| $TR_{Drv}$ | : Drive transistor |
| $TR_{EL\_C\_1}$ | : First light emission control transistor |
| $TR_{EL\_C\_2}$ | : Second light emission control transistor |
| $C_1$ | : Capacitance portion |
| $C_2$ | : Auxiliary capacitance portion |
| ELP | : Light-emitting portion |
| $C_{EL}$ | : Parasitic capacitance of light-emitting portion |
| DTL | : Data line |
| SCL | : Scanning line |
| $CL_{EL\_C\_1}$ | : First emission control line |
| $CL_{EL\_C\_2}$ | : Second emission control line |
| $CSL_1$ | : First current supply line |
| $CSL_2$ | : Second current supply line |

FIG.2

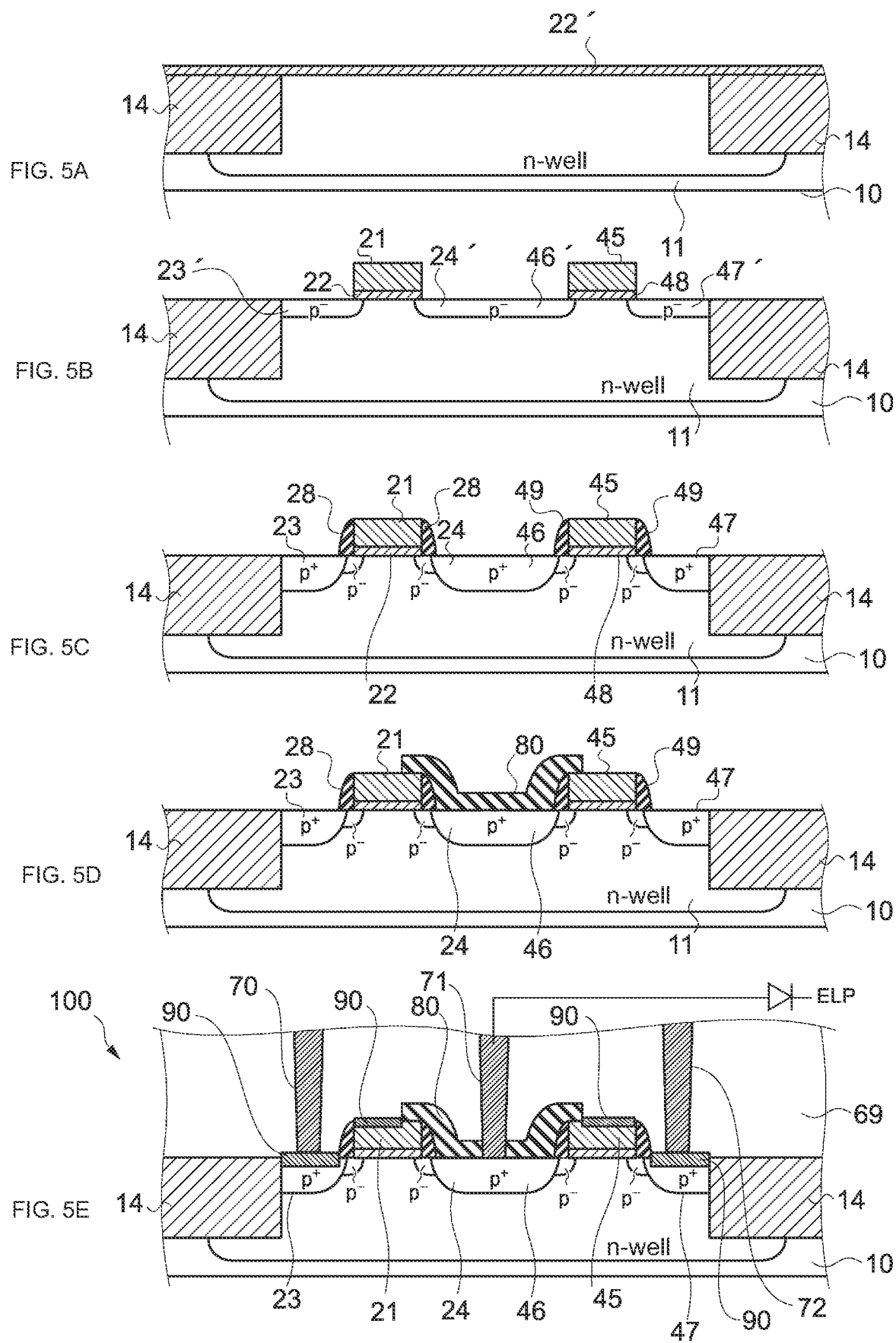

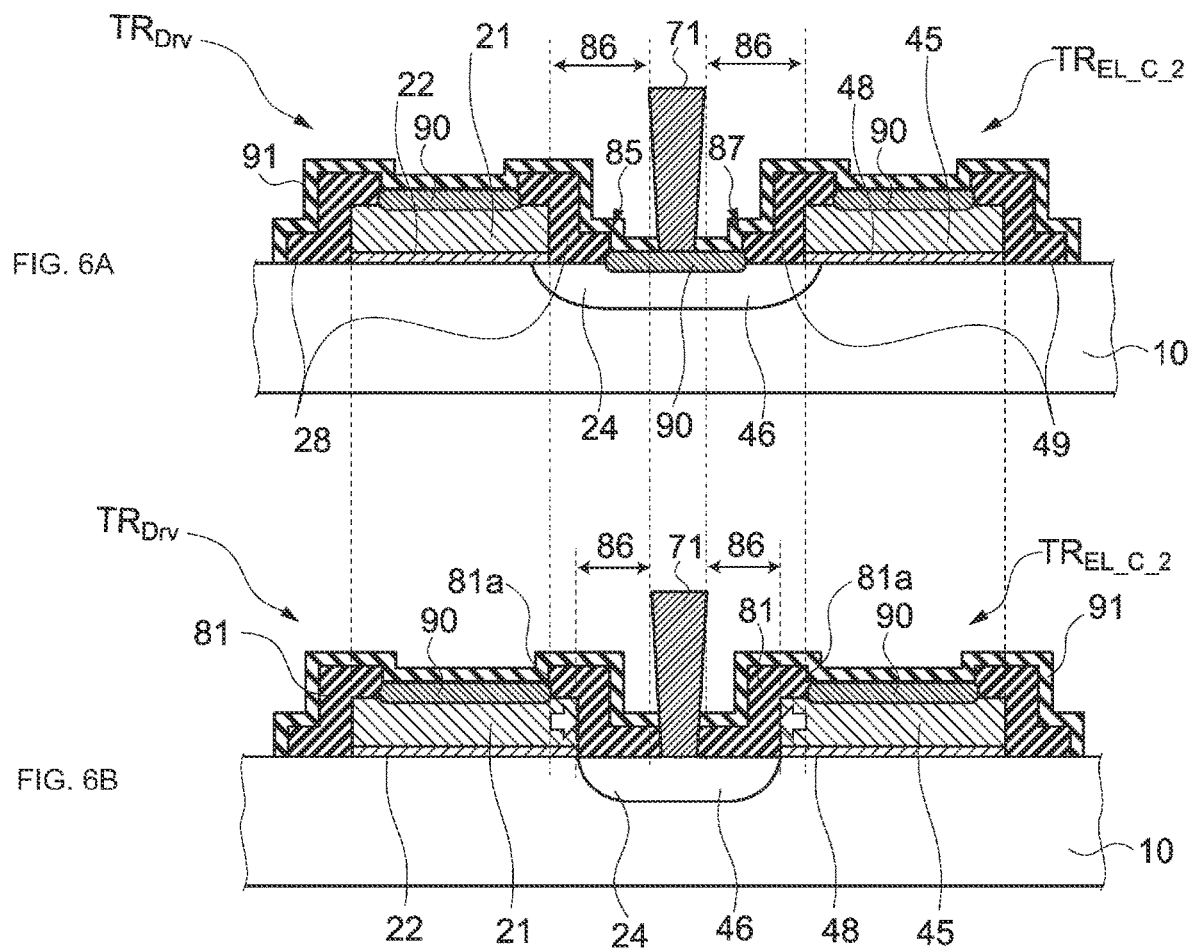

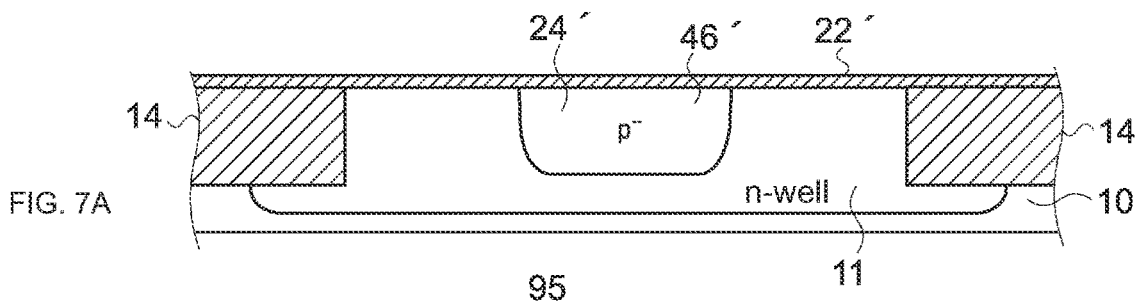

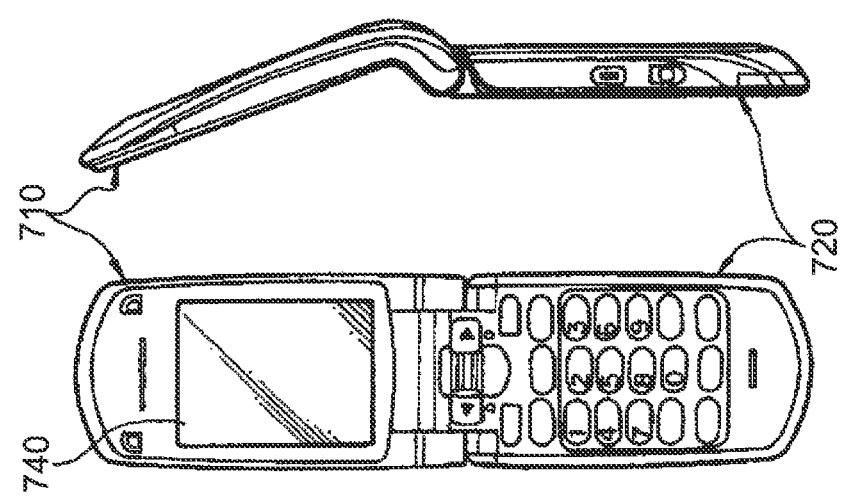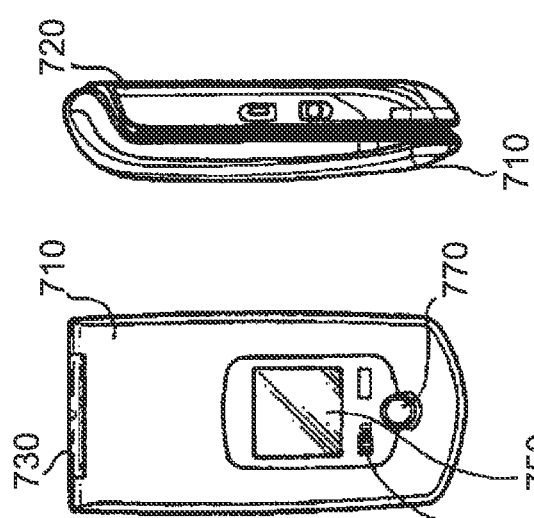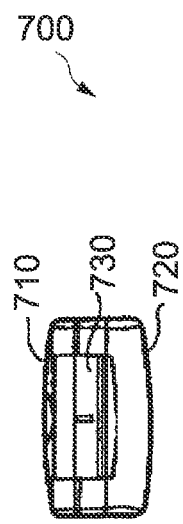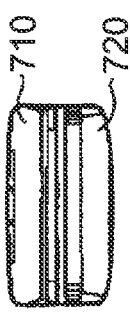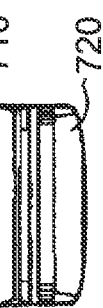

DISPLAY DEVICE AND ELECTRONIC APPARATUS

CROSS REFERENCE TO RELATED APPLICATIONS

This application is a U.S. National Phase of International Patent Application No. PCT/JP2019/034549 filed on Sep. 3, 2019, which claims priority benefit of Japanese Patent Application No. JP 2018-173766 filed in the Japan Patent Office on Sep. 18, 2018. Each of the above-referenced applications is hereby incorporated herein by reference in its entirety.

TECHNICAL FIELD

The present technology relates to a display device including a light-emitting element and an electronic apparatus.

BACKGROUND ART

Organic electroluminescence display devices (hereinafter, referred to as organic EL display devices) using organic electroluminescence diodes (organic light-emitting diodes, hereinafter, sometimes referred to as OLEDs), which are light-emitting elements, have characteristics of low power consumption due to self-luminescence and have been developed for practical use.

In particular, it has been advanced to form a pixel circuit and its peripheral circuit of the organic EL display device on the same single crystal silicon substrate by a silicon semiconductor fine process, and apply the organic EL display device to, for example, the viewfinder of an electronic apparatus such as a small display (see, e.g., Patent Literature 1).

In a transistor constituting the circuit, generally, silicide formed by reacting a silicon substrate and metal so as to reduce the contact resistance between the contact metal and the silicon substrate is formed in a diffusion layer.

CITATION LIST

Patent Literature

Patent Literature 1: JP-A-2013-44890

DISCLOSURE OF INVENTION

Technical Problem

When the above-mentioned silicide is formed to constitute the organic EL display device, unreacted metal may diffuse into the silicon substrate to become an unnecessary leakage source. If such unreacted metal becomes a leakage source and an unnecessary leakage current flows into the OLED, a bright spot defect such as unnecessary light emission of the OLED may occur.

In view of the circumstances as described above, it is an object of the present technology to provide a display device and an electronic apparatus, in which occurrence of a bright spot defect is suppressed.

Solution to Problem

In order to achieve the object described above, a display device according to an embodiment of the present technology includes a light-emitting portion and a drive circuit.

The drive circuit includes a transistor that drives the light-emitting portion and includes a first diffusion layer and a first contact electrode, the first diffusion layer including no silicide formed in a silicon region, the first contact electrode being electrically connected to the first diffusion layer.

According to such a configuration, a metal layer is not formed on the diffusion layer in which silicide is not formed at the time of the silicide forming step, and thus unreacted metal generated at the time of the silicide forming step is suppressed from being diffused into the diffusion layer in which silicide is not formed. This suppresses the occurrence of a bright spot defect due to the inflow of an unnecessary leakage current into the light-emitting portion, which is caused by the unreacted metal.

The drive circuit may include a transistor that includes a second diffusion layer and a second contact electrode, the second diffusion layer including silicide formed in a silicon region, the second contact electrode being electrically connected to the second diffusion layer.

The first diffusion layer may have a lower impurity concentration of a diffusion layer surface than the second diffusion layer.

The first diffusion layer may include a deeper region than the second diffusion layer.

The drive circuit may include a transistor including the first diffusion layer connected to the light-emitting portion via the first contact electrode.

The transistor including the first diffusion layer may be a drive transistor that operates as a current limiting element.

The drive circuit may include an image signal writing transistor that includes the first diffusion layer and turns on or off a drive current flowing through the light-emitting portion.

The drive circuit may further include an insulating film that covers the first diffusion layer.

The light-emitting portion may be an organic electroluminescent diode.

In order to achieve the object described above, an electronic apparatus according to an embodiment of the present technology includes a display device.

The display device includes a light-emitting portion, and a drive circuit including a transistor that drives the light-emitting portion and includes a first diffusion layer and a first contact electrode, the first diffusion layer including no silicide formed in a silicon region, the first contact electrode being electrically connected to the first diffusion layer.

BRIEF DESCRIPTION OF DRAWINGS

FIG. 2 is an equivalent circuit diagram of the display device described above.

FIGS. 5A, 5B, 5C, 5D, and 5E are manufacturing process diagram showing part of the manufacturing process of the circuit of the display device of the second embodiment.

FIGS. 6A and 6B are diagram for describing the difference between a configuration when silicide is formed in a diffusion layer and a configuration when silicide is not formed.

FIGS. 7A, 7B, 7C, 7D, and 7E are manufacturing process diagram showing part of the manufacturing process of the circuit of a display device of a third embodiment.

FIGS. 14A, 14B, 14C, 14D, 14E, 14F, and 14G are diagram showing the appearance of a mobile phone as an electronic apparatus.

MODE(S) FOR CARRYING OUT THE INVENTION

Hereinafter, a display device according to an embodiment of the present disclosure, specifically, an organic electroluminescence (EL) display device including an organic electroluminescence (EL) diode (hereinafter, referred to as an OLED) as a light-emitting element will be described with reference to the drawings. Hereinafter, the organic EL display device may be simply referred to as a display device.

[Configuration of Organic EL Display Device]

Figure 1:
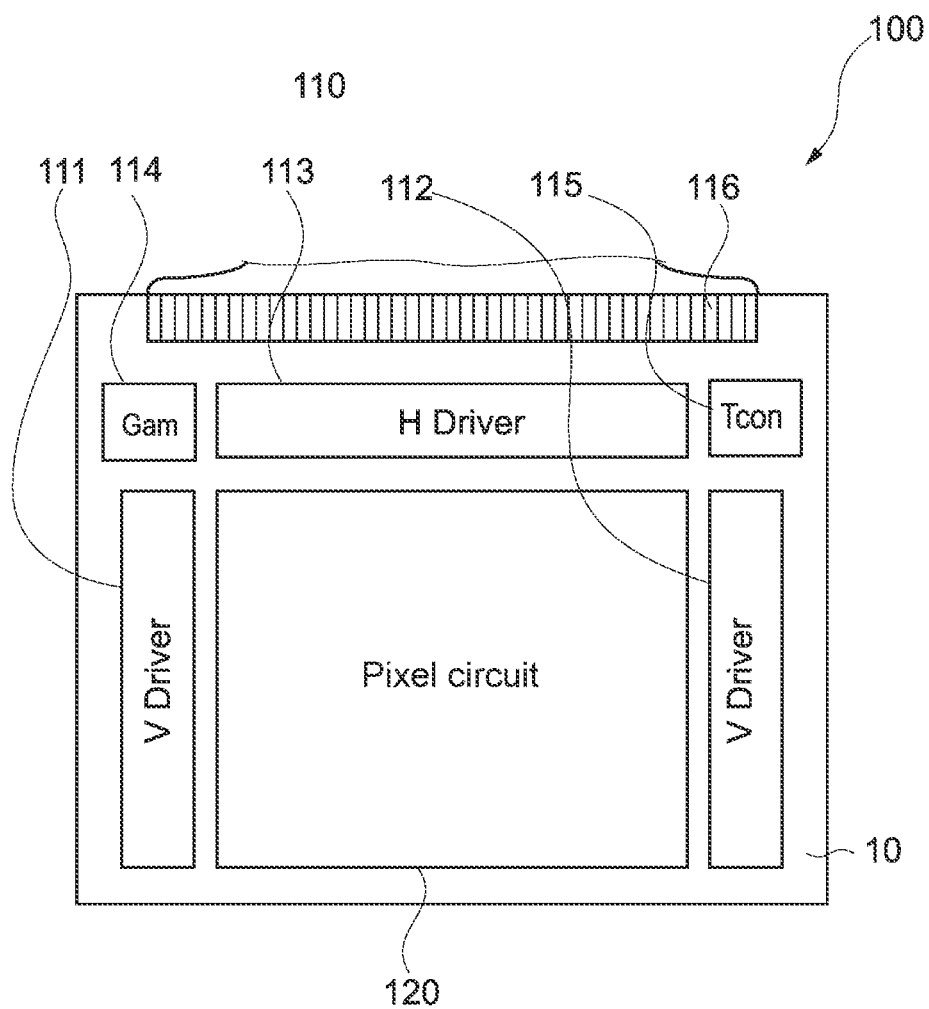
FIG. 1 is a diagram showing a schematic configuration of a display device according to an embodiment of the present disclosure.

FIG. 1 shows a schematic configuration of a display device 100.

FIG. 2 is an equivalent circuit diagram of a light-emitting element including a drive circuit in the display device. FIG. 2 is an example in which a pixel circuit is a drive circuit including four transistors TRDrv, TRSig, TREl_c, and TREl_c_2 and two capacitance portions C1 and C2 (4Tr/2C drive circuit).

As shown in FIG. 1, the display device 100 includes a peripheral circuit 110 and a pixel circuit 120 that are drive circuits and formed simultaneously on a single crystal silicon semiconductor substrate (hereinafter, sometimes referred to as a silicon semiconductor substrate) 10 including a silicon region. The silicon semiconductor substrate 10 includes an input and output terminal 116, which is configured such that a flexible wiring board is connectable thereto.

The pixel circuit 120 corresponds to an image display region of the display device 100. The display region includes a plurality of pixels two-dimensionally arranged in the row direction and the column direction over the entire surface. In the display region, an image based on a video signal input from the peripheral circuit is displayed by driving each pixel.

The peripheral circuit 110 includes a horizontal drive circuits (V Drivers) 111 and 112, a vertical drive circuit (H Driver) 113, a gamma voltage generator circuit (Gam) 114, and a timing controller (Tcon) 115.

The horizontal drive circuits 111 and 112 correspond to a scanning circuit 103 and a light emission control transistor control circuit 104, which will be described later.

The vertical drive circuit 113 corresponds to an image signal output circuit 105 to be described later.

The pixel circuit 120 and the peripheral circuit 110 each includes a transistor.

As shown in FIG. 2, the display device 100 includes a first current supply unit 101 and a second current supply unit 102, and the scanning circuit 103, the light emission control transistor control circuit 104, and the image signal output circuit 105 as the peripheral circuit.

Furthermore, the display device 100 includes, in the display region, a light-emitting element 1, a current supply line (first current supply line CSL1), a second current supply line CSL2, a scanning line SCL, a first emission control line CLEl_c_1, a second emission control line CLEl_c_2, and a data line DTL.

A plurality of first current supply lines CSL1 is arranged and connected to the first current supply unit 101.

A fixed voltage Vcc is supplied from the first current supply unit 101 to the first current supply lines CSL1.

A plurality of second current supply lines CSL2 is connected to the second current supply unit 102 and arranged extending in a direction orthogonal to the direction in which the first current supply lines CSL1 are arranged.

A fixed voltage Vcc is supplied from the second current supply unit 102 to the second current supply lines CSL2.

A plurality of scanning lines SCL is connected to the scanning circuit 103 and arranged extending in a direction parallel to the direction in which the first current supply lines $CSL_1$ are arranged.

A scanning signal is sequentially supplied from the scanning circuit 103 to the scanning lines SCL.

A plurality of first emission control lines CLEl_c_1 is connected to the light emission control transistor control circuit 104 and arranged extending in a direction parallel to the direction in which the first current supply lines CSL1 are arranged.

A light emission control signal is sequentially supplied from the light emission control transistor control circuit 104 to the first emission control line CLEl_c_1.

The second emission control line CLEl_c_2 is connected to the light emission control transistor control circuit 104. A light emission control signal is sequentially supplied from the light emission control transistor control circuit 104 to the second emission control line CLEl_c_2.

A plurality of data lines DTL is connected to the image signal output circuit 105 and arranged extending in a direction orthogonal to the direction in which the first current supply lines CSL1 are arranged.

An image signal (drive signal or luminance signal) VSig and a predetermined reference potential Vofs are switched and supplied from the image signal output circuit 105 to the data lines DTL.

The light-emitting element 1 includes a light-emitting portion (specifically, organic EL light-emitting portion) ELP, and the pixel circuit 120 for driving the light-emitting portion ELP.

The display region for displaying an image includes light-emitting elements 1 arranged in a two-dimensional matrix. The light-emitting element 1 constitutes a pixel.

The display device 100 may have a configuration for monochrome display in the display region or may have a configuration for color display therein. In the case of the color display configuration, one pixel includes, for example, three sub-pixels (a red light-emitting sub-pixel that emits red light, a green light-emitting sub-pixel that emits green light, and a blue light-emitting sub-pixel that emits blue light).

The light-emitting portion ELP is formed above a plurality of transistors constituting the pixel circuit 120 via an interlayer insulating layer.

The light-emitting portion ELP is a current-driven optical element whose light emission luminance changes in accordance with the current flowing through the light-emitting portion ELP. In this embodiment, the light-emitting portion ELP is constituted by an OLED. The light-emitting portion ELP has a well-known configuration or structure including an anode electrode 51, an organic material layer, a cathode electrode 53, and the like. The organic material layer has a structure in which, for example, a hole transport layer, a light-emitting layer, and an electron transport layer are stacked.

The pixel circuit 120 for driving the light-emitting portion ELP includes a drive transistor TRDrv, an image signal writing transistor TRSig, a first light emission control transistor TREl_c_1, a second light emission control transistor TREl_c_2, a first capacitance portion C1, and a second capacitance portion C2.

The anode electrode 51 is connected to another source/drain region 24 of the drive transistor TRDrv and to one source/drain region 46 of the second light emission control transistor TREl_c_2.

The cathode electrode 53 is connected to a ground line, and a predetermined cathode voltage Vcath is supplied to the ground line. Note that, in FIG. 2, reference symbol CEL represents the parasitic capacitance of the light-emitting portion ELP.

In this embodiment, the drive transistor TRDrv, the image signal writing transistor TRSig, the first light emission control transistor TREl_c_1, and the second light emission control transistor TREl_c_2 are each made of a p-type channel MOSFET and formed in an n-type well formed in the p-type silicon semiconductor substrate 10.

The drive transistor TRDrv drives the light-emitting portion ELP on the basis of the image signal (drive signal or luminance signal) VSig held in the capacitance portion C1. The drive transistor TRDrv operates as a current limiting element.

The drive transistor TRDrv includes a gate electrode 21, one source/drain region 23, and the other source/drain region 24.

In the drive transistor TRDrv, the one source/drain region 23 is connected to one electrode 41 of the first capacitance portion C1 via a contact electrode 70 formed in an interlayer insulating layer to be described later, and further connected to another source/drain region 37 of the first light emission control transistor TREl_c_1.

The one source/drain region 23 is connected to the one electrodes 41 of the first capacitance portion C1 and constitutes a second node ND2.

In the embodiment, the one source/drain region 23 specifically functions as a source region when the light-emitting portion ELP emits light.

The other source/drain region 24 is connected to the anode electrode 51 of the light-emitting portion (organic EL light-emitting portion) ELP via another contact electrode 71 formed in the interlayer insulating layer to be described later and a contact pad.

In the embodiment, the other source/drain region 24 specifically functions as a drain region when the light-emitting portion ELP emits light.

The gate electrode 21 is connected to another electrode 42 of the first capacitance portion C1 via a contact pad and still another contact electrode formed in the interlayer insulating layer and constitutes a first node ND1. The gate electrode 21 is further connected to another source/drain region 34 of the image signal writing transistor TRSig.

The image signal writing transistor TRSig causes the capacitance portion C1 to hold the image signal VSig.

The image signal writing transistor TRSig includes a gate electrode 31, one source/drain region 33, and the other source/drain region 34.

In the image signal writing transistor TRSig, the one source/drain region 33 is connected to the image signal output circuit 105 via still another contact electrode formed in the interlayer insulating layer, a contact pad, and the data line DTL.

In the embodiment, the one source/drain regions 33 specifically functions as a source region when the image signal is written.

The gate electrode 31 is connected to the operating circuit 103 via still another contact electrode formed in the interlayer insulating layer, a contact pad, and the scanning line SCL.

The other source/drain region 34 is connected to the gate electrode 21 of the drive transistor TRDrv and to the other end 42 of the first capacitance portion C1 via still another contact electrode formed in the interlayer insulating layer.

In the embodiment, the other source/drain region 34 specifically functions as a drain region when the image signal is written.

In the display device 100, an operation signal is supplied to each sub-pixel through the gate electrode 31 of the image signal writing transistor TRSig from the scanning circuit 103, and an image signal is held in the capacitance portion C1 through the image signal writing transistor TRSig from the image signal output circuit 105. The drive transistor TRDrv is controlled to be turned on or off in response to the signal held in the capacitance portion C1. Thus, a drive current is flowed into the light-emitting portion ELP, holes and electrons are recombined in the light-emitting layer, and emission occurs.

The first light emission control transistor TREl_c_1 includes a gate electrode 35, one source/drain region 36, and the other source/drain region 37.

The gate electrode 35 is connected to the first emission control line CLEl_c_1 via still another contact electrode formed in the interlayer insulating layer.

The one source/drain region 36 is connected to the current supply line CSL1 via still another contact electrode formed in the interlayer insulating layer.

The other source/drain region 37 is connected to the one source/drain region 23 of the drive transistor TRDrv and to the one end 41 of the first capacitance portion C1 via still another contact electrode formed in the interlayer insulating layer.

The second light emission control transistor TREl_c_2 includes a gate electrode 45, the one source/drain region 46, and another source/drain region 47.

The gate electrode 45 is connected to the second emission control line CLEl_c_2 via still another contact electrode formed in the interlayer insulating layer.

The one source/drain region 46 is connected to the other source/drain region 24 of the drive transistor TRDrv via still another contact electrode formed in the interlayer insulating layer.

The other source/drain region 47 has a potential VSS.

The first capacitance portion C1 includes the one electrode (the one end) 41, the other electrode (the other end) 42, and a dielectric layer (insulating layer) sandwiched between the electrodes 41 and 42.

The one end 41 of the first capacitance portion C1 is connected to the second current supply line CSL2 via the second capacitance portion C2 and is connected to the one source/drain region 23 of the drive transistor TRDrv and the other source/drain region 37 of the first light emission control transistor TREl_c_1.

The other end 42 of the first capacitance portion C1 is connected to the gate electrode 21 of the drive transistor TRDrv.

The second capacitance portion C2 includes one electrode (one end), another electrode (another end), and a dielectric layer (insulating layer) sandwiched between those electrodes.

The one end of the second capacitance portion C2 is connected to the second current supply line CSL2.

The other end of the second capacitance portion C2 is connected to the one end 41 of the first capacitance portion C1 or the like.

Figure 3:
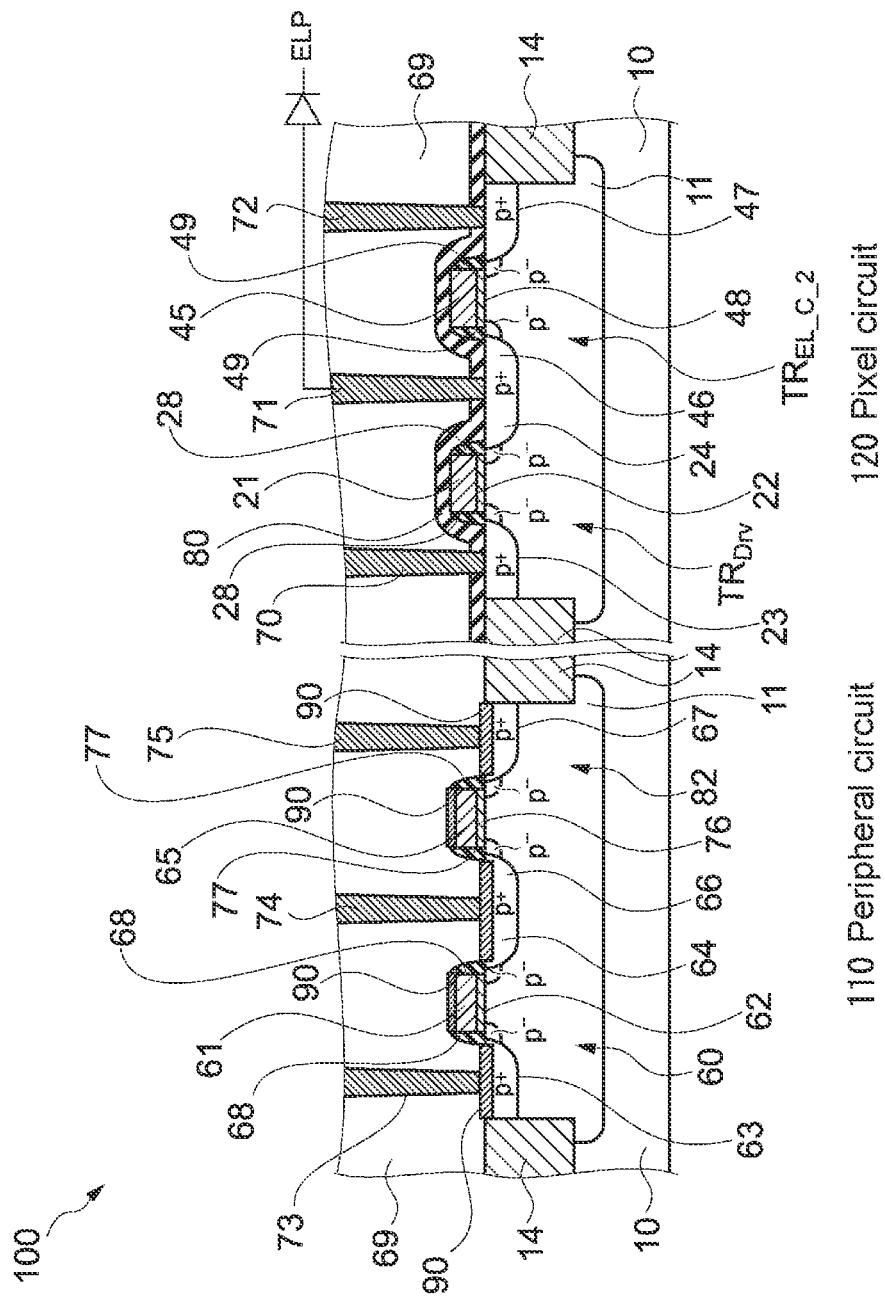
FIG. 3 is a cross-sectional schematic view of a main portion of a pixel circuit and a peripheral circuit of a display device of a first embodiment.
Figure 4:
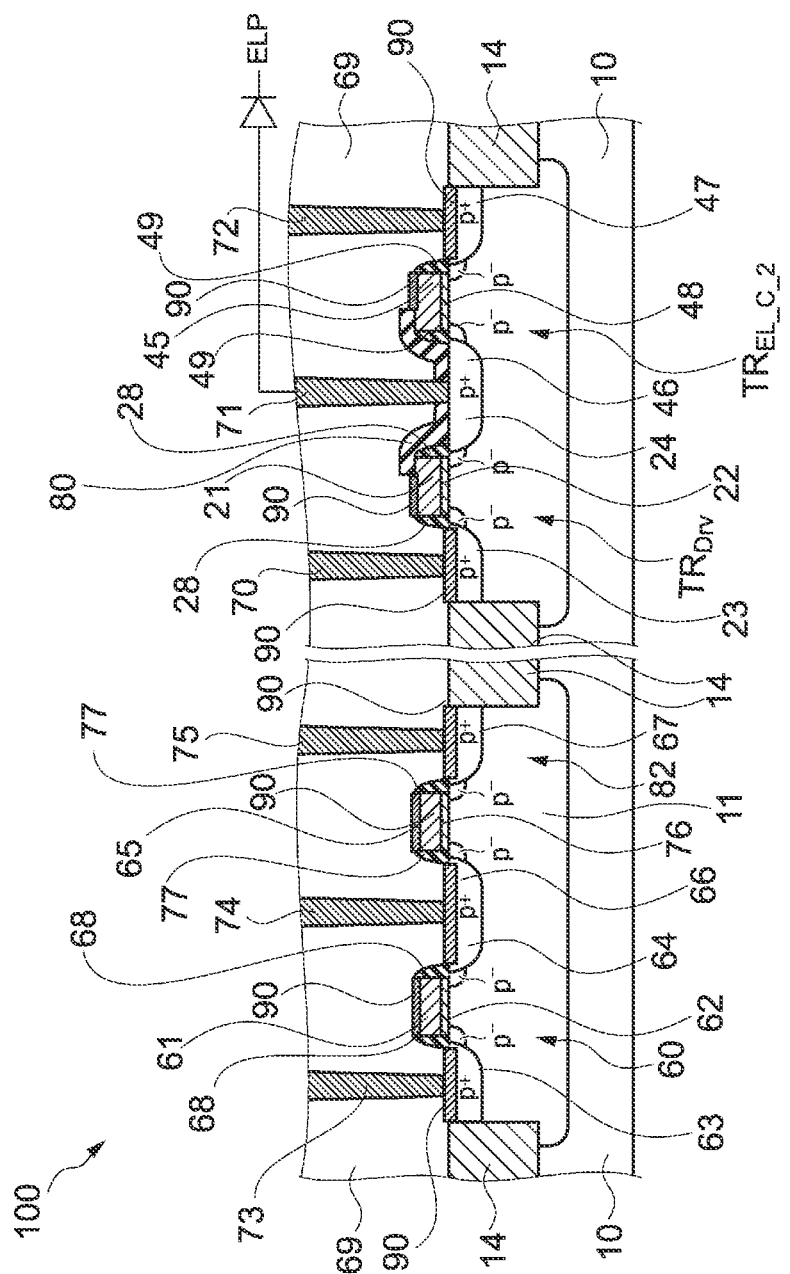
FIG. 4 is a cross-sectional schematic view of a main portion of a pixel circuit and a peripheral circuit of a display device of a second embodiment.

Each source/drain region described above includes a high concentration p-type diffusion layer and a low concentration p-type diffusion layer formed on the silicon semiconductor substrate 10 including a silicon region. In FIGS. 3 and 4 to be described later, a diffusion layer having a relatively low impurity concentration is shown as p−, and a diffusion layer having a high impurity concentration is shown as p+.

The contact electrode described above is a conductive layer that is formed in the interlayer insulating layer and electrically connects a pair of conductive layers disposed through the interlayer insulating layer to each other. The conductive layer disposed through the interlayer insulating layer includes a diffusion layer, wiring such as a signal line, a scanning line, a current supply line, and a lead line, electrodes such as a gate electrode, an electrode to form a capacitance portion, and an electrode to form a light-emitting portion, and the like.

Here, in general, in order to reduce the contact resistance, silicide is provided at the boundary between the contact electrode and the diffusion layer formed on the silicon semiconductor substrate 10.

In the present technology, in the pixel circuit 120 formed on the silicon semiconductor substrate 10, all or some of the diffusion layers constituting part of the plurality of transistors have a configuration in which silicide is not formed.

Specifically, a display device according to a first embodiment to be described later has a configuration in which silicide is not formed in all of the diffusion layers of the plurality of transistors constituting the pixel circuit 120. Details of the first embodiment will be described later with reference to FIG. 3.

A display device according to a second embodiment to be described later has a configuration in which silicide is not formed in some of the diffusion layers constituting the plurality of transistors constituting the pixel circuit 120. Details of the second embodiment will be described later with reference to FIG. 4.

Note that in the first and second embodiments, the diffusion layers constituting the transistors constituting the peripheral circuit 110 have a configuration in which silicide is formed in order to reduce the contact resistance with the contact electrode.

FIGS. 3 and 4 each show, on the right, a partial cross-sectional schematic view of the case where the drive transistor TRDrv and the second light emission control transistor TREl_c_2 constituting part of the pixel circuit 120 are electrically connected to each other in the diffusion layer, and on the left, a partial cross-sectional schematic view of the case where a transistor 60 and a transistor 82 constituting part of the peripheral circuit 110 are electrically connected to each other in the diffusion layer. In FIGS. 3 and 4, reference numeral 14 represents an element isolation region.

As shown in FIGS. 3 and 4, the drive transistor TRDrv includes the gate electrode 21, a gate insulating film 22, the one source/drain region 23, the other source/drain region 24, and sidewalls 28.

The one source/drain region 23 is electrically connected with the contact electrode 70. The other source/drain region 24 is electrically connected with the contact electrode 71.

The second light emission control transistor TREl_c_2 includes the gate electrode 45, a gate insulating film 48, the one source/drain region 46, the other source/drain region 47, and sidewalls 49.

The one source/drain region 46 is electrically connected with the contact electrode 71. The other source/drain region 47 is electrically connected with a contact electrode 72.

The other source/drain region 24 of the drive transistor TRDrv and the one source/drain region 46 of the second light emission control transistor TREl_c_2 are electrically connected to each other, the connection of which is made by sharing a diffusion layer.

As shown in FIGS. 3 and 4, in the peripheral circuit 110, the transistor 80 includes a gate electrode 61, a gate insulating film 62, one source/drain region 63, another source/drain region 64, and sidewalls 68.

The one source/drain region 63 is electrically connected with a contact electrode 73. The other source/drain region 64 is electrically connected with a contact electrode 74.

The transistor 82 includes a gate electrode 65, a gate insulating film 76, one source/drain region 66, another source/drain region 67, and sidewalls 77.

The one source/drain region 66 is electrically connected with the contact electrode 74. The other source/drain region 67 is electrically connected with a contact electrode 75.

The other source/drain region 64 of the transistor 60 and the one source/drain region 66 of the transistor 82 are electrically connected to each other, the connection of which is made by sharing a diffusion layer.

First Embodiment (Cross-Sectional View of Display Device)

As shown in FIG. 3, in the display device 100, the pixel circuit 120 (peripheral circuit 110) includes the source/drain regions (diffusion layers including a high concentration p-type diffusion layer and a low concentration p-type diffusion layer) 23, 24, 46, and 47 (63, 64, 66, and 67) formed in an n-type diffusion layer (n-well) 11 of the silicon semiconductor substrate 10.

In the pixel circuit 120, the gate electrode 21 (45) is formed on the silicon semiconductor substrate 10 via the gate insulating film 22 (48). The sidewalls 28 (49) are formed on the side walls of the gate electrode 21 (45) and the gate insulating film 22 (48).

Furthermore, an insulating film 80 and an interlayer insulating layer 69 are formed on the entire surface of the silicon semiconductor substrate 10 including the gate insulating film 22 (48), the gate electrode 21 (45), and the sidewalls 28 (49). The contact electrodes 70, 71, and 72 are formed in the insulating film 80 and the interlayer insulating layer 69.

The contact electrode 70 electrically connects the one source/drain region 23 of the drive transistor TRDrv and the other source/drain region 37 of the first light emission control transistor TREl_c_1 (not shown).

The contact electrode 71 connects the other source/drain region 24 of the drive transistor TRDrv and the one source/drain region 46 of the second light emission control transistor TREl_c_2 to the light-emitting portion ELP (not shown), more specifically, to the anode electrode 51 of the light-emitting portion ELP.

The contact electrode 72 electrically connects the other source/drain region 47 of the second light emission control transistor TREl_c_2 and wiring connecting a power supply VSS (not shown).

The gate electrode 21 may be formed of, for example, polycrystalline silicon.

The insulating film 80 may be formed of an oxide film, a nitride film, or a stacked film thereof.

The insulating film 80 is formed so as to cover at least a diffusion layer in a region where silicide is not formed. In other words, the insulating film 80 is formed in a silicide non-formation region.

In the peripheral circuit 110, each of the gate electrode 61 (65), the one source/drain region 63 (66), and the other source/drain region 64 (67) is electrically connected to wiring (not shown) through the contact electrodes 73 and 74 (74 and 75) or the like formed in the interlayer insulating layer 69 formed on the transistor 60 (80).

In the peripheral circuit 110, the gate electrode 61 (65) is formed on the silicon semiconductor substrate 10 via the gate insulating film 62 (76). The sidewalls 68 (77) are formed on the side walls of the gate electrode 61 (65) and the gate insulating film 62 (76).

The interlayer insulating layer 69 is formed on the entire surface of the silicon semiconductor substrate 10 including the gate insulating film 62 (76), the gate electrode 61 (65), and the sidewalls 68 (77). The contact electrodes 73, 74, and 75 are formed in the interlayer insulating layer 69.

Silicide 90 is formed on each of the surfaces of the one source/drain regions 63 and 66, the other source/drain regions 64 and 67, and the gate electrodes 61 and 65, which are diffusion layers. That is, the silicide 90 is formed on each of the surfaces of the one source/drain regions 63 and 66 and the other source/drain regions 64 and 67, which are diffusion layers to which the contact electrodes 73, 74, and 75 are electrically connected. The silicide 90 is also formed on the surface of the gate electrode 61 to which another contact electrode (not shown) is electrically connected.

As described above, in this embodiment, the diffusion layers of the plurality of transistors that is formed in the silicon region and constitutes the pixel circuit 120 have a configuration in which silicide is not formed. That is, the display device 100 has a configuration in which silicide is not formed in the pixel circuit 120 and silicide is formed in the peripheral circuit 110.

In this embodiment, the source/drain regions 23, 24, 33, 34, 36, 37, 46, and 47 of the drive transistor TRDrv, the image signal writing transistor TRSig, the first light emission control transistor TREL_c_1, and the second light emission control transistor TREL_c_2 each correspond to a first diffusion layer, which is the diffusion layer in which silicide is not formed. Then, the contact electrodes (which are configurations denoted by reference numerals 70, 71, and 72 in FIG. 3) electrically connected to the respective first diffusion layers each correspond to a first contact electrode.

The source/drain regions 63, 64, 66, and 67 of the transistors 60 and 82 formed in the peripheral circuit 120 each correspond to a second diffusion layer, which is the diffusion layer in which the silicide is formed. Then, the contact electrodes (which are configurations denoted by reference numerals 73, 74, and 75 in FIG. 4) electrically connected to the respective second diffusion layers each correspond to a second contact electrode.

Here, the silicide is formed by forming a metal layer on the diffusion layer and then performing heat treatment to react the silicon atoms with the metal atoms of the metal layer. The silicide is formed on the surface of the diffusion layer. Subsequently, the metal layer unreacted with the silicon atoms is removed, and the silicide is annealed to stabilize the silicide.

In this embodiment, in the display region where the pixel circuit 120 is formed, the silicide forming process is performed in a state where the insulating film 80 is provided. Therefore, a metal layer for forming silicide is not formed directly on the diffusion layer covered with the insulating film 80 provided in a region to be a silicide non-formation region. Therefore, the unreacted metal of the metal layer is suppressed from being diffused into the silicon semiconductor substrate 10.

This suppresses the occurrence of a sudden increase of a junction current due to the unreacted metal diffused into the silicon semiconductor substrate 10, suppresses an unnecessary leakage current from flowing into the light-emitting portion ELP to unnecessarily emit light from the OLED, and suppresses generation of a bright spot defect. In addition, black luminance can be improved.

In this manner, a display device with high display quality in which a bright spot defect is suppressed can be obtained.

Note that in the present technology the state in which silicide is not formed in the diffusion layer means a state in which silicidation is intentionally prevented. Therefore, for example, a state in which a metal other than the metal used for forming silicide is unexpectedly mixed is excluded.

Second Embodiment (Main Cross-Sectional View of Light-Emitting Element)

Hereinafter, the second embodiment will be described with reference to FIG. 4. The configurations similar to those described above are denoted by similar reference symbols, and description thereof may be omitted.

Since the peripheral circuit 110 is similar to that shown in FIG. 3, description thereof will be omitted.

In this embodiment, the other source/drain region 24 of the drive transistor TRDrv and the one source/drain region 46 of the light emission control transistor TREl_c_2 each correspond to the first diffusion layer, which is the diffusion layer in which silicide is not formed, and the contact electrode 71 electrically connected to the other source/drain region 24 and the one source/drain region 46 corresponds to the first contact electrode.

The one source/drain region 23 of the drive transistor TRDrv, the other source/drain region 47 of the second light emission control transistor TREl_c_2, and the source/drain regions 33, 34, 36, 37, 63, 64, 66, and 67 of the image signal writing transistor TRSig, the first light emission control transistor TREl_c_1, and the transistors 60 and 82 formed in the peripheral circuit 120 each correspond to the second diffusion layer, which is the diffusion layer in which silicide is formed. Then, the contact electrodes (which are configurations denoted by reference numerals 70, 72 to 75 in FIG. 4) electrically connected to the respective second diffusion layers each correspond to the second contact electrode.

As shown in FIG. 4, the pixel circuit 120 (peripheral circuit 110) includes the source/drain regions (diffusion layers including a high concentration p-type diffusion layer and a low concentration p-type diffusion layer) 23, 24, 46, and 47 (63, 64, 66, and 67) formed in the n-type diffusion layer 11 of the silicon semiconductor substrate 10.

In the pixel circuit 120, the gate electrode 21 (45) is formed on the silicon semiconductor substrate 10 via the gate insulating film 22 (48). The sidewalls 28 (49) are formed on the side walls of the gate electrode 21 (45) and the gate insulating film 22 (48).

The insulating film 80 is formed to cover the other source/drain region 24, the one source/drain region 46, part of the gate electrodes 21 and 45, and part of the side walls 28 and 49.

The silicide 90 is formed in a region, of the surface of the gate electrode 21 (45), in which the insulating film 80 is not formed.

The silicide 90 is formed on each of the surfaces of the one source/drain region 23 and the other source/drain region 47.

The silicide 90 is not formed on each of the surfaces of the other source/drain region 24 and the one source/drain region 46.

The interlayer insulating layer 69 is formed on the entire surface of the silicon semiconductor substrate 10 including the gate insulating films 22 and 48, the gate electrodes 21 and 45, the side walls 28 and 49, and the insulating film 80. The contact electrodes 70 and 72 are formed in the interlayer insulating layer 69, and the contact electrode 71 is formed in the insulating film 80 and the interlayer insulating layer 69.

The contact electrode 70 electrically connects the one source/drain region 23 of the drive transistor TRDrv and the other source/drain region 37 of the first light emission control transistor TREl_c_1 (not shown).

The contact electrode 71 electrically connects the other source/drain region 24 of the drive transistor TRDrv and the one source/drain region 46 of the second light emission control transistor TREl_c_2 to the anode electrode 51 of the light-emitting portion ELP (not shown).

The contact electrode 72 is connected to the other source/drain region 47 of the second light emission control transistor TREl_c_2 and wiring connecting a power supply VSS (not shown).

In this embodiment, the following configuration is provided: among the diffusion layers of the plurality of transistors that is formed in the silicon region and constitutes the pixel circuit 120, silicide is not formed in the other source/drain region (diffusion layer) 24 of the drive transistor TRDrv and the one source/drain region 46 of the second light emission control transistor TREl_c_2, which are electrically connected to the anode electrode 51 of the light-emitting portion ELP, and silicide is formed in the other diffusion layers.

In such a manner, when the pixel circuit 120 is provided with a configuration in which the insulating film 80 is partially provided and the silicide is not formed in some diffusion layers, the insulating film 80 suppresses the unreacted metal from being diffused into the silicon semiconductor substrate 10 as compared with the case of forming silicide in all the diffusion layers. Thus, the occurrence of a bright spot defect due to an unnecessary leakage current flowing into the light-emitting portion ELP is suppressed.

Furthermore, in this embodiment, since silicide is formed in the diffusion layers other than the other source/drain region (diffusion layer) 24 of the drive transistor TRDrv and the one source/drain region 46 of the second light emission control transistor TREl_c_2 in the pixel circuit 120, it is possible to reduce the contact resistance between the contact metal and the source/drain region. Thus, it is possible to perform signal processing in the pixel circuit 120 at high speed.

As described above, in the display device of this embodiment, the occurrence of a bright spot defect due to an unnecessary leakage current flowing into the light-emitting portion ELP is suppressed, and high-speed signal processing is made possible. Therefore, a display device having a high display quality and excellent display characteristics can be obtained.

Note that this embodiment provides the configuration in which silicide is not formed in the other source/drain region (diffusion layer) 24 of the drive transistor TRDrv and the one source/drain region 46 of the second light emission control transistor TREl_c_2, which are electrically connected to the anode electrode 51 of the light-emitting portion ELP, but the present technology is not limited thereto. For example, a configuration in which silicide is not formed in the diffusion layer of the image signal writing transistor TRSig may be provided. In addition, a configuration in which silicide is not formed in both the diffusion layer of the drive transistor TRDrv and the diffusion layer of the image signal writing transistor TRSig may be provided.

(Manufacturing Method) Next, a manufacturing method for the display device 100 according to the second embodiment will be described with reference to FIGS. 5A, 5B, 5C, 5D, and 5E. Here, an example of manufacturing part of the drive transistor TRDrv and the second light emission control transistor TREL_c_2 shown in FIG. 4 will be described. Note that the manufacturing method of the first embodiment and the manufacturing method of the second embodiment are basically the same except that the region where the insulating film 80 is formed is different from each other.

FIGS. 5A, 5B, 5C, 5D, and 5E are manufacturing process diagram showing part of the manufacturing process of the pixel circuit 120 of the display device 100 of the second embodiment. First, as shown in (A) of FIG. 5A, after an inter-element separation region 14 is formed in the silicon semiconductor substrate 10, ion implantation of impurities is performed to form the n-type diffusion layer 11, and a gate insulating film 22' is then deposited.

Next, polysilicon (polycrystalline silicon) serving as a gate electrode is deposited on the gate insulating film 22' by a chemical vapor deposition (CVD) method, to further form a resist pattern corresponding to the gate electrode. The polysilicon and the gate insulating film 22' are etched using the resist pattern as a mask to form the gate electrodes 21 and 45 and the gate insulating films 22 and 48. Next, as shown in FIG. 5B, ion implantation is performed to form shallow junction regions 23' and 24'.

Next, a silicon oxide film is formed on the entire surface of the silicon semiconductor substrate 10 by the CVD method, and dry etching is performed to form the sidewalls 28 and 49. Next, ion implantation is performed to form the one source/drain regions 23 and 46 and the other source/drain regions (diffusion layers) 24 and 47 as shown in FIG. 5C.

Next, a gate insulating film 80' is formed on the entire surface of the silicon semiconductor substrate 10. A resist pattern corresponding to the silicide non-formation region is formed on the gate insulating film 80', and the gate insulating film 80' is patterned by dry etching or the like with the resist pattern being used as a mask, to form the insulating film 80 as shown in FIG. 5D. In the second embodiment, the insulating film 80 is formed so as to cover the surfaces of the other source/drain region (diffusion layer) 24 of the drive transistor TRDrv and the one source/drain region (diffusion layer) 46 of the second light emission control transistor TREl_c_2, and is not formed on the other diffusion layers. Here, in the forming process of the insulating film 80 in the manufacturing method for the display device according to the first embodiment, the insulating film 80 is formed in all region to be the pixel circuit 120, and the insulating film 80 is not formed in the region of the peripheral circuit 110.

Next, a metal layer is deposited on the entire surface of the silicon semiconductor substrate 10 by sputtering and heated to form the silicide 90. Note that examples of the metal used for the silicide include cobalt, nickel, and titanium. In this process, by heating the silicon semiconductor substrate 10 including the metal layer formed on the surface thereof, the silicon atoms and the metal atoms of the metal layer react, and the portion where the silicon and the metal layer are in contact with each other is changed to the silicide 90. Note that even if the metal layer is formed on the insulating film 80 and then heated, the metal layer on the insulating film 80 remains metal. Next, the metal layer unreacted with the silicon atoms is removed. As a result, the silicide 90 is left on the gate electrode 21, the one source/drain region 23, and the other source/drain region 47, on which the insulating film 80 is not formed. Further, the silicide 90 is annealed to stabilize the silicide 90. Subsequently, as shown in FIG. 5E, the interlayer insulating layer 69 is formed, and the contact electrodes 70, 71, and 72 are formed.

Note that FIGS. 5A, 5B, 5C, 5D, and 5E show an example of forming the insulating film 80 so as to cover part of the gate electrode 21, but the insulating film 80 may be formed so as to cover all of the gate electrode 21, or the insulating film 80 may be formed so as to expose the gate electrode 21. Silicide is formed in the surface portion of the gate electrode 21, in which the insulating film 80 is not formed.

In the manufacturing process described above, when the side walls 28 and 49 are formed, the insulating film 80 provided corresponding to the silicide non-formation region may be formed at the same time. As described above, the sidewalls 28 and 49 are formed by dry etching after forming a silicon oxide film by the CVD method. At the time of the dry etching, the silicon oxide film is etched so as to remain also in the portion corresponding to the silicide non-formation region, and the insulating film 80 can be formed together with the sidewalls 28 and 49.

FIGS. 6A and 6B are partially enlarged cross-sectional views of the drive transistor TRDrv and the second light emission control transistor TREI_c_2. FIG. 6A corresponds to a view of the case where only the side walls 28 and 49 are formed. In such a configuration, the sidewalls 28 and 49 define the silicide non-formation regions. FIG. 6B corresponds to a view of the case where an insulating film and sidewalls corresponding to a silicide non-formation region are formed at the same time as described above. In FIG. 6B, an insulating film provided in a silicide non-formation region including sidewalls is denoted by reference numeral 81. In FIGS. 6A and 6B, reference numeral 91 denotes a nitride film for a contact etching stopper used at the time of forming a contact electrode.

As shown in of FIG. 6A, the side walls 28 and 49 determine the formation regions of the silicide 90, and silicide is not formed in the region of the diffusion layer covered with the sidewalls 28 and 49. The sidewalls 28 (49) are formed along the shape of the gate electrode 21 while covering the sidewalls of the gate electrode 21 (45). One end of the sidewall 28 (49) is located on the other source/drain region 24 (one source/drain region 46), and the other end of the sidewall 28 (49) is located on the gate electrode 21 (45). The one end of the sidewall 28 (49) located on the other source/drain region 24 (one source/drain region 46) forms a step 85 (87).

An opening failure occurs due to a connection failure when the contact electrode 71 is formed on the step 85 (87). For that reason, in order that the contact electrode 71 is not formed on the step 85 (87), it is necessary to separate the gate electrode 21 (45) and the contact electrode 71 with a certain distance 86 in the design.

In contrast, in the display device 100 according to the present technology, as shown in FIG. 6B, since silicide is not formed in the other source/drain region 24 and the one source/drain region 46, the insulating film 81 is formed so as to cover the surfaces of the other source/drain region 24 and the one source/drain region 46.

In the configuration shown in FIG. 6B, an end portion 81a of the insulating film 81 is located on the gate electrode 21, 45, and an end portion of the insulating film 81 is not located on the surfaces of the other source/drain region 24 and the one source/drain region 46. The step 85 (87) as shown in FIG. 6A is not present on the surface of the other source/drain region 24 (one source/drain region 46).

Therefore, it is possible to arrange the gate electrode 21, 45 and the contact electrode 71 at positions closer to each other as compared with the case where the steps 85 and 87 are provided, and it is possible to shorten the distance 86 between the gate electrode 21, 45 and the contact electrode 71.

Thus, the degree of freedom in design such as arrangement of the gate electrode, the source/drain region, and the like of the transistor is improved. For example, it is possible to reduce the pixel pitch while maintaining the arrangement area of the transistor. Further, as can be seen by comparing FIGS. 6A and 6B, in the display device 100 according to the present technology, it is possible to enlarge the length of the gate electrode, i.e., to increase the channel length.

Here, in the case where the size of the transistor is simply reduced, the transistor is susceptible to processing variations, and characteristics of the transistor are liable to vary.

In contrast, in this embodiment, it is possible to maintain the arrangement area of the transistor, and thus it is possible to reduce variations in the characteristics of each transistor and to obtain a display device in which the luminance uniformity in the substrate plane is improved. Furthermore, it is possible to reduce the pixel pitch, and thus it is possible to obtain a high-definition display device.

Further, when the degree of freedom in design is improved, for example, the number of contact electrodes can be increased, and redundancy against opening failures of the contact electrodes can be increased.

Further, for example, it is possible to increase the degree of freedom in arrangement of the contact electrodes, and thus the degree of freedom in routing of the wiring connected to the contact electrodes is improved.

Third Embodiment

In the display device manufactured by the manufacturing process shown in FIGS. 5A, 5B, 5C, 5D, and 5E described above, when an OLED is used for the light-emitting portion, a high reverse bias voltage such as 7 V or more is applied between the anode electrode 51 and the silicon semiconductor substrate 10. When such a high reverse bias voltage is applied, a large reverse voltage applied to the p-n junction causes a breakdown phenomenon (breakdown) to flow a large junction leakage current, and a desired display quality is not obtained in some cases. This is because it is necessary to prevent impurity ions from penetrating from the gate electrode to the channel layer through the gate oxide film during ion implantation, and there is a limit to the high acceleration of ion implantation during formation of a shallow junction region.

In contrast, in this embodiment, as shown in FIGS. 7A, 7B, 7C, 7D, and 7E, prior to the formation of the gate electrode, deep ion implantation is selectively performed at high implantation acceleration on the diffusion layer in which no silicide is to be formed and to which a high voltage is to be applied (in this embodiment, the other source/drain region 24 of the drive transistor TRDrv and the one source/drain region 46 of the second light emission control transistor TREI_c_2, which are to be electrically connected to the light-emitting portion ELP, to form a low concentration p region.

Thus, as in the display device 100 shown in FIG. 7E, the depth of the p-n junction (depth of the diffusion layer) of the other source/drain region 24 and the one source/drain region 46, which are the diffusion layers to which a high voltage is to be applied, can be made larger than the depth of the p-n junction (depth of the diffusion layer) of the one source/drain region 23 and the other source/drain region 47. Further, although not shown, the depth of the p-n junction of the other source/drain region 24 and the one source/drain region 46 can be made larger than the depth of the p-n junction in the diffusion layer of the transistor other than the drive transistor TRDrv and the second light emission control transistor TREI_c_2. In such a manner, the diffusion layer to which a high voltage is to be applied is set to a region deeper than the other diffusion layers, and thus it is possible to mitigate the electric field. Hereinafter, a manufacturing method for the display device according to this embodiment will be described with reference to FIGS. 7A, 7B, 7C, 7D, and 7E.

FIGS. 7A, 7B, 7C, 7D, and 7E are manufacturing process diagram showing part of a manufacturing process of the circuit of the display device 100 of the third embodiment. Also in FIGS. 7A, 7B, 7C, 7D, and 7E, description will be given using an example of manufacturing part of the drive transistor TRDrv and the second light emission control transistor TREI_c_2 in the pixel circuit 120. The configurations similar to those in the embodiments described above are denoted by similar reference symbols, and description thereof may be omitted.

FIGS. 7A, 7B, 7C, 7D, and 7E are manufacturing process diagram showing part of the manufacturing process of the pixel circuit of the display device of the third embodiment.

First, after the inter-element separation region 14 is formed in the silicon semiconductor substrate 10, ion implantation of impurities is performed to form the n-type diffusion layer 11. Subsequently, ions are deeply implanted at high implantation acceleration only in the region to be the other source/drain region 24 and the one source/drain region 46 (diffusion layer), which are to be electrically connected to the anode electrode 51 and to which a high voltage is to be applied, to form deep low concentration p regions 24' and 46'. Subsequently, as shown in FIG. 7A, a gate insulating film 22' is formed.

Next, polysilicon (polycrystalline silicon) serving as a gate electrode is formed on the gate insulating film 22' by a chemical vapor deposition (CVD) method, to further form a resist pattern corresponding to the gate electrode. Subsequently, the polysilicon and the gate insulating film 22' are etched using the resist pattern as a mask to form the gate electrodes 21 and 45 and the gate insulating films 22 and 48. Next, a resist pattern 95 is formed so as to cover the low concentration p regions 24' and 46' that are to be the other source/drain region 24 of the drive transistor TRDrv and the one source/drain region 46 of the second light emission control transistor TREI_c_2 and to expose the other diffusion layers. Next, as shown in FIG. 7B, ion implantation is performed using the resist pattern 95 as a mask, to form shallow junction regions (FIGS. 7A, 7B, 7C, 7D, and 7E show only shallow junction region 23' and 47') in the other diffusion layers other than the low concentration p region 24' and 46', which are the diffusion layers to be the other source/drain region 24 and the one source/drain region 46. Subsequently, the resist pattern 95 is removed.

Next, a silicon oxide film is deposited on the entire surface of the silicon semiconductor substrate 10 by the CVD method, and dry etching is performed to form the sidewalls 28 and 49. Next, ion implantation is performed to form the one source/drain region 23 and the other source/drain region 47 as shown in FIG. 7C. Thus, as shown in FIG. 7C, the other source/drain region 24 and the one source/drain region 46 each have a deeper region in the thickness direction of the silicon semiconductor substrate 10 than the diffusion layers other than those source/drain regions. Further, the other source/drain region 24 and the one source/drain region 46 are each a region having an impurity concentration gradient in the thickness direction of the silicon semiconductor substrate 10. Note that, as described in the second embodiment, a configuration may be provided in which an insulating film provided corresponding to a silicide non-formation region, which will be described later, is formed simultaneously with the formation of the side walls.

Next, an insulating film is deposited on the entire surface of the silicon semiconductor substrate 10. A resist pattern corresponding to the silicide non-formation region is formed on the insulating film, and the insulating film is patterned by dry etching or the like with the resist pattern being used as a mask, to form an insulating film 80 as shown in FIG. 7D. In the third embodiment, the insulating film 80 is formed so as to cover the other source/drain region (diffusion layer) 24 of the drive transistor TRDrv and the one source/drain region 46 of the second light emission control transistor TREI_c_2, and is not formed on the other diffusion layers.

Next, a metal layer is deposited on the entire surface of the silicon semiconductor substrate 10 by sputtering and heated to form silicide 90. Next, the metal layer unreacted with the silicon atoms is removed. As a result, the silicide 90 is left on the diffusion layer on which the insulating film 80 is not formed (in FIGS. 7A, 7B, 7C, 7D, and 7E, part of the gate electrode 21, the one source/drain regions 23, and the one source/drain regions 46. Further, the silicide 90 is annealed to stabilize the silicide 90. Subsequently, as shown in FIG. 7E, the interlayer insulating layer 69 is formed, and the contact electrodes 70, 71, and 72 are formed.

Thus, in addition to the configuration in which a diffusion layer to which a high voltage is to be applied is set to a diffusion layer in which silicide is not formed, and such a diffusion layer is set to a deeper diffusion layer than the other diffusion layers in which silicide is formed, and thus it is possible to mitigate the electric field and to suppress the occurrence of a breakdown phenomenon. Such a configuration is suitable for a display device to which a high voltage is to be applied, such as an organic EL display device.

As an example, the depth of the diffusion layer in which silicide is not formed can be 300 nm or less, and the depth of the diffusion layer in which silicide is formed can be larger than 300 nm. Note that those numerical values are appropriately set according to the pixel pitch or the like.

Fourth Embodiment

In the pixel circuit shown in FIG. 2, the operation (Vth correction) to make the manufacturing variations of a threshold voltage Vth of the drive transistor TRDrv uniform between the pixel circuits can be performed by using a capacitance element formed for each pixel (e.g., the first capacitance portion C1).

Here, in the display device, when the transistor is miniaturized by achieving high definition, the capacitance element (capacitance value) is also reduced and the ratio of the parasitic capacitance is relatively increased, and a Vth correction function does not work sufficiently. For example, in the pixel circuit shown in FIG. 2, in the image signal writing transistor TRSig, the ratio of the parasitic capacitance of the node 34 on the gate electrode 21 side of the drive transistor TRDrv is relatively increased. In particular, when a transistor constituting the pixel circuit 120 is formed on the silicon semiconductor substrate 10, the parasitic capacitance formed in the p-n junction of the other source/drain region 24 and the silicon semiconductor substrate 10 is increased.

On the other hand, in this embodiment, ion implantation to form the impurity region of the other source/drain region 24 is not performed, and thus the surface of the other source/drain region 24 has a lower impurity concentration than the surfaces of the other diffusion layers.

Figure 8A:
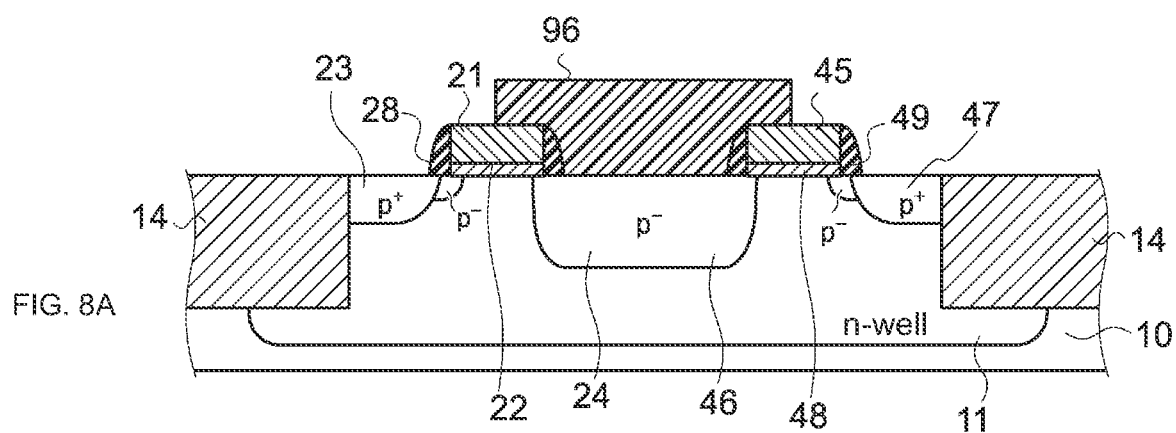
FIGS. 8A and 8B are manufacturing process diagram showing part of the manufacturing process of the circuit of a display device of a fourth embodiment.
Figure 8B:
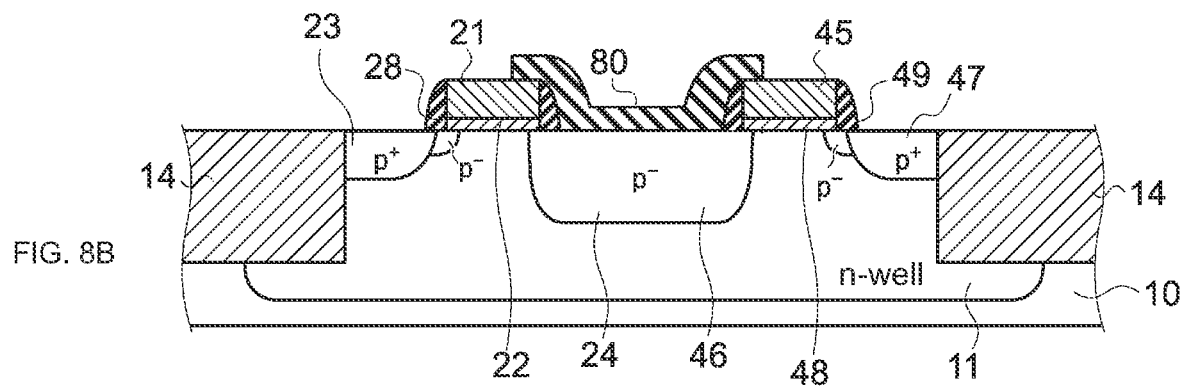

Specifically, in the manufacturing process described in the second embodiment, the ion implantation is performed after the formation of the side walls 28 and 49. However, in this embodiment, after the formation of the sidewalls 28 and 49, the ion implantation is performed in a state where the other source/drain region 24 and the one source/drain region 46 are covered with a resist pattern 96 as shown in FIG. 8A. As a result, the surface of the other source/drain region 24 has a lower impurity concentration than the surfaces of the other diffusion layers. Subsequently, as shown in FIG. 8B, the insulating layer 80 is formed by the manufacturing procedure described in the second embodiment.

Here, in the display device, when the writing operation of the image signal is performed, the source voltage of the drive transistor increases to the emission voltage of the light-emitting portion ELP. With this fluctuation of the source voltage, the gate voltage of the drive transistor also increases due to the coupling of the held capacitance. The ratio of the rise of the gate voltage to the rise of the source voltage is called a bootstrap gain. Such a bootstrap gain may be reduced due to the parasitic capacitance of a transistor in the pixel circuit. The parasitic capacitance of a transistor in the pixel circuit has a threshold voltage Vth of that transistor as a parameter. Therefore, due to variations in the threshold voltage Vth of the transistor in the pixel circuit, the bootstrap gain may vary for each pixel. In this case, the light emission luminance varies for each pixel, and the luminance uniformity of the screen is impaired.

In contrast, in this embodiment, the depletion layer width can be increased by setting the surface of the other source/drain region (diffusion layer) 24, to which a high voltage is to be applied, to a region in which the impurity ion concentration is lower than that of the surfaces of the other diffusion layers. Therefore, the electric field between the other source/drain region 24 and the n-type diffusion layer (n-well) 11 can be mitigated, the parasitic capacitance between the other source/drain region 24 and the n-type diffusion layer (n-well) 11 can be reduced, and the bootstrap gain can be improved.

Thus, the correction accuracy of the variations in the threshold voltage Vth of the drive transistor is improved, and the luminance uniformity of the screen can be improved.

Figure 9:
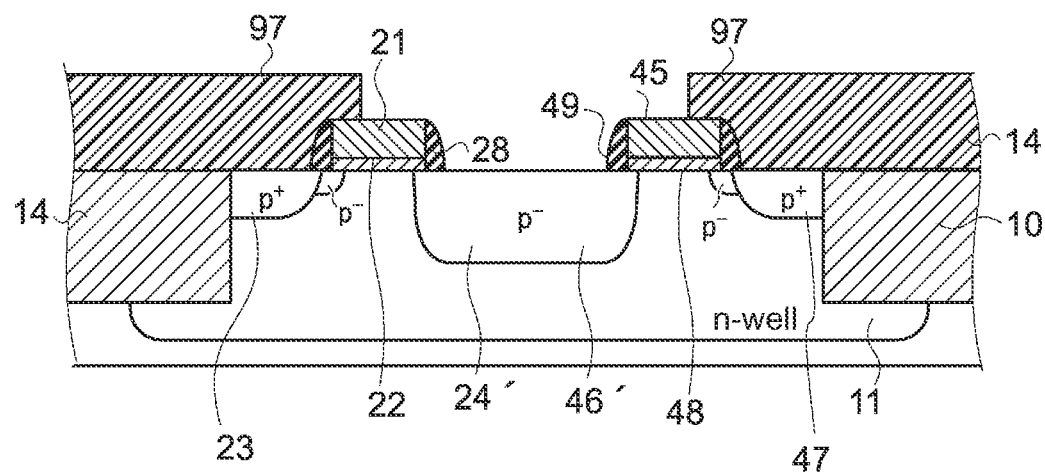
FIG. 9 is a manufacturing process diagram showing part of another manufacturing process of the circuit of the display device of the fourth embodiment.

Note that if the ion implantation described with reference to FIGS. 8A and 8B are not performed in the manufacturing and the contact resistance becomes problematic, the other source/drain region 24 and the one source/drain region 46 may be formed under an optimal ion implantation condition in which the reduction of the parasitic capacitance and the contact resistance are compatible with each other, in a state where the diffusion layers other than the other source/drain region 24 and the one source/drain region 46 are covered with a resist pattern 97 as shown in FIG. 9 after the process of FIG. 8A.

Embodiments of Electronic Apparatus

The organic EL display device of the present disclosure is incorporated in, for example, various electric apparatuses of application examples 1 to 6 to be described later. Note that the application examples are not limited to these, and the organic EL display device of the present disclosure may be applied to, for example, other electronic apparatuses such as a portable information terminal, a smart phone, a portable music player, a game machine, an electronic book, various display units in an electronic dictionary, and an electronic viewfinder.

The organic EL display device of the present disclosure as described above has a stable display quality even if miniaturized and provides high definition, and thus it is possible to provide a high display quality image to the user of the electronic apparatus in which the organic EL display device is incorporated.

Application Example 1

Figure 10:
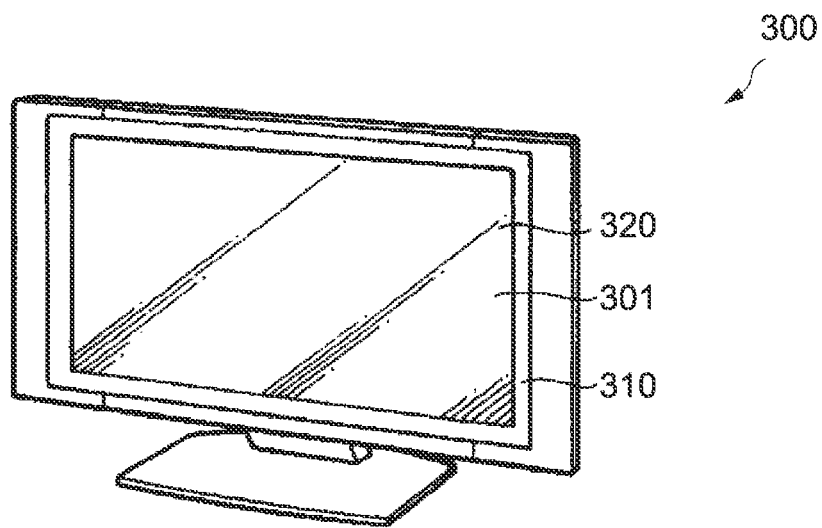
FIG. 10 is a diagram showing the appearance of a television device as an electronic apparatus.

FIG. 10 shows the appearance of a television apparatus 300 as an electronic apparatus. The television apparatus includes, for example, a video display screen unit 301 including a front panel 310 and filter glass 320. The video display screen unit 301 includes the display device according to the embodiment described above.

Application Example 2

Figure 11A:
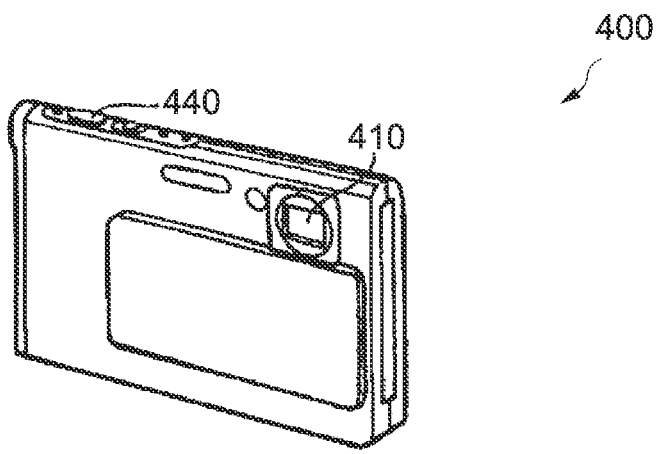
FIGS. 11A and 11B are diagram showing the appearance of a digital camera as an electronic apparatus.
Figure 11B:
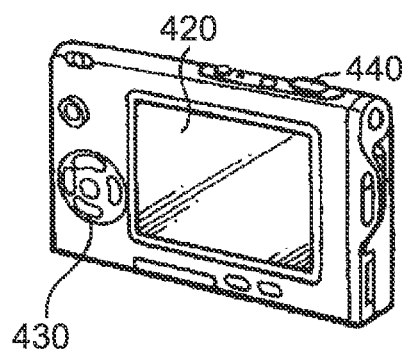

FIGS. 11A and 11B show the appearance of a digital camera 400 as an electronic apparatus. The digital camera includes, for example, a light-emitting portion 410 for a flash, a display unit 420, a menu switch 430, and a shutter button 440. The display unit 420 includes the display device according to the embodiment described above.

Application Example 3

Figure 12:
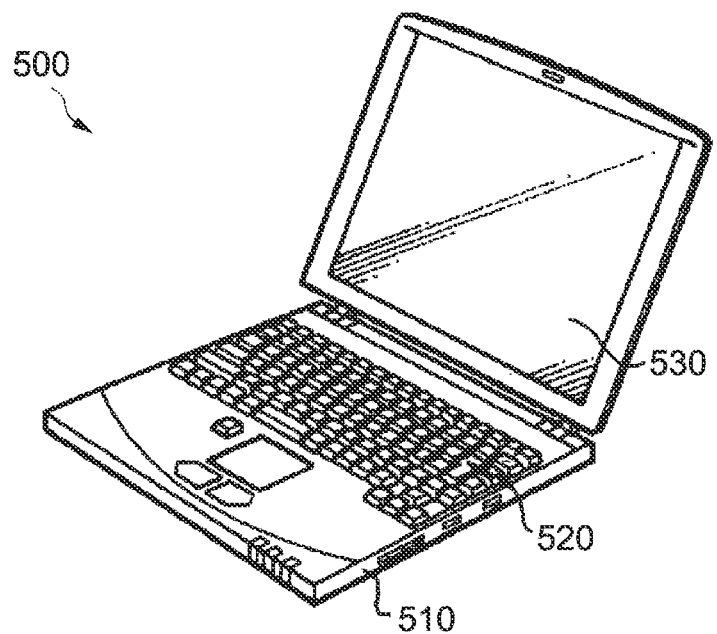
FIG. 12 is a diagram showing the appearance of a notebook personal computer as an electronic apparatus.

FIG. 12 shows the appearance of a notebook personal computer 500 as an electronic apparatus. The notebook personal computer includes, for example, a main body 510, a keyboard 520 for an operation of inputting characters and the like, and a display unit 530 for displaying an image. The display unit 530 includes the display device according to the embodiment described above.

Application Example 4

Figure 13:
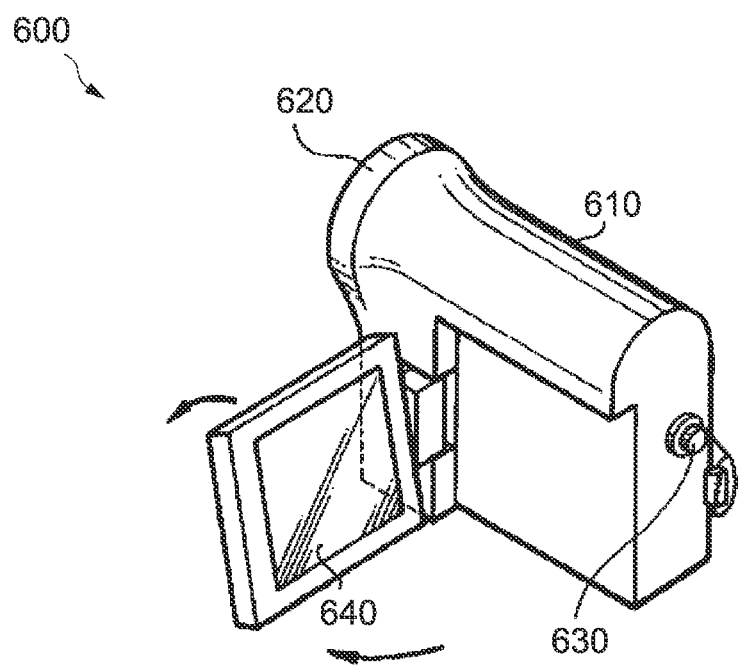
FIG. 13 is a diagram showing the appearance of a video camera as an electronic apparatus.

FIG. 13 shows the appearance of a video camera 600 as an electronic apparatus. The video camera includes, for example, a main body 610, a lens 620 for imaging a subject that is provided on a forward side surface of the main body 610, a start/stop switch 630 for imaging, and a display unit 640. The display unit 640 includes the display device according to the embodiment described above.

Application Example 5

FIGS. 14A, 14B, 14C, 14D, 14E, 14F, and 14G shows the appearance of a mobile phone 700 as an electronic apparatus. The mobile phone is obtained by, for example, connecting an upper housing 710 and a lower housing 720 with a connecting portion (hinge portion) 730, and includes a display 740, a sub-display 750, a picture light 760, and a camera 770. The display 740 or the sub-display 750 includes the display device according to the embodiment described above.

Application Example 6

Figure 15:
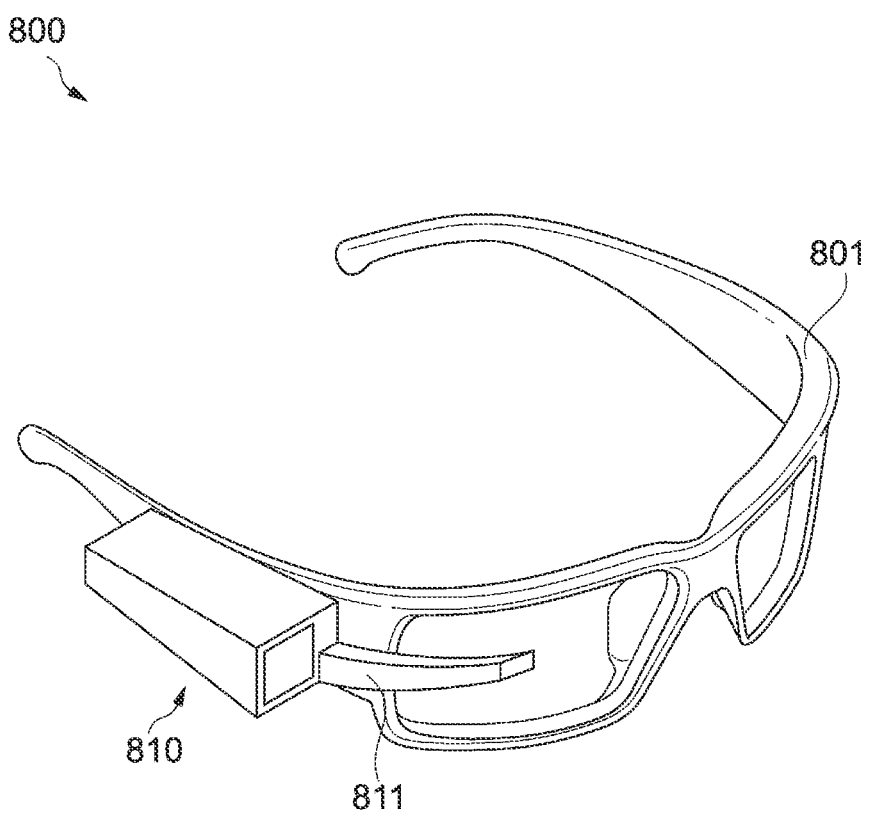
FIG. 15 is a diagram showing the appearance of a head-mounted display as an electronic apparatus.

FIG. 15 shows the appearance of a head-mounted display 800 as an electronic apparatus. This head-mounted display is obtained by mounting an eyewear-mounted one-eye display 810 on an eyewear 800 such as glasses, goggles, or sunglasses. The eyewear-mounted one-eye display 810 includes the display device according to the embodiment described above.

Further, the display device according to the embodiment described above can be applied to, for example, a head-mounted display for virtual reality (VR), augmented reality (AR), or mixed reality (MR) as another form of the head-mounted display.

The embodiments of the present technology are not limited to the embodiments described above and can be variously modified without departing from the gist of the present technology.

For example, in the embodiments described above, the example in which the transistor is formed on the silicon semiconductor substrate has been described, but the transistor may be configured to be formed on a substrate of glass or the like, on which a semiconductor film is formed as a silicon region.

In the embodiments described above, a PMOS in which the conductivity type of the channels of the various transistors is p-type has been exemplified, but an n-type NMOS may be used.

Further, in the embodiments described above, the pixel circuit including the four transistors (drive transistor TRDrv, the image signal writing transistor TRSig, the first light emission control transistor TREl_c_1, and the second light emission control transistor TREl_c_2) and the two capacitance portions (the first capacitance portion C1 and the second capacitance portion C2) has been exemplified. However, the present technology is not limited thereto, and it is sufficient to include at least a plurality of transistors. For example, the pixel circuit may include three transistors and one capacitance portion, three transistors and two capacitance portions, or four transistors and one capacitance portion.

Further, in the embodiments described above, the case where there is no silicide non-formation region in the peripheral circuit has been described, but a silicide non-formation region may also be provided in the peripheral circuit.

Further, in the embodiments described above, the case where the light-emitting portion is configured using an OLED, but another light-emitting portion of a self-luminous type such as an inorganic electroluminescence light-emitting portion, a light-emitting diode (LED) light-emitting portion, or a semiconductor laser light-emitting portion may be used as the light-emitting portion.

Note that the present technology may take the following configurations.

(1) A display device, including:
a light-emitting portion; and
a drive circuit including a transistor that drives the light-emitting portion and includes a first diffusion layer and a first contact electrode, the first diffusion layer including no silicide formed in a silicon region, the first contact electrode being electrically connected to the first diffusion layer.

(2) The display device according to (1), in which
the drive circuit includes a transistor that includes a second diffusion layer and a second contact electrode, the second diffusion layer including silicide formed in a silicon region, the second contact electrode being electrically connected to the second diffusion layer.

(3) The display device according to (2), in which
the first diffusion layer has a lower impurity concentration of a diffusion layer surface than the second diffusion layer.

(4) The display device according to (2) or (3), in which
the first diffusion layer includes a deeper region than the second diffusion layer.

(5) The display device according to any one of (1) to (4), in which
the drive circuit includes a transistor including the first diffusion layer connected to the light-emitting portion via the first contact electrode.

(6) The display device according to (5), in which
the transistor including the first diffusion layer is a drive transistor that operates as a current limiting element.

(7) The display device according to any one of (1) to (6), in which
the drive circuit includes an image signal writing transistor that includes the first diffusion layer and turns on or off a drive current flowing through the light-emitting portion.

(8) The display device according to any one of (1) to (7), in which
the drive circuit further includes an insulating film that covers the first diffusion layer.

(9) The display device according to any one of (1) to (8), in which
the light-emitting portion is an organic electroluminescent diode.

(10) An electronic apparatus, including
a display device including
a light-emitting portion, and
a drive circuit including a transistor that drives the light-emitting portion and includes a first diffusion layer and a first contact electrode, the first diffusion layer including no silicide formed in a silicon region, the first contact electrode being electrically connected to the first diffusion layer.

REFERENCE SIGNS LIST

10 silicon semiconductor substrate (silicon region)
21, 31, 35, 61 gate electrode (diffusion layer)
23 one source/drain region of drive transistor TRDrv (first diffusion layer, second diffusion layer)
24 another source/drain electrode of drive transistor TRDrv (first diffusion layer)
33 one source/drain region of image signal writing transistor TRSig (first diffusion layer, second diffusion layer)
34 another source/drain region of image signal writing transistor TRSig (first diffusion layer, second diffusion layer)
36 one source/drain region of first light emission control transistor TREl_c_1 (first diffusion layer, second diffusion layer)
37 another source/drain region of first light emission control transistor TREl_c_1 (first diffusion layer, second diffusion layer)
46 one source/drain region of second light emission control transistor TREl_c_2 (first diffusion layer)

47 another source/drain electrode of second light emission control transistor TREl_c_2 (first diffusion layer)
63 another source/drain region of transistor of peripheral circuit (second diffusion layer)
64 another source/drain region of transistor of peripheral circuit (second diffusion layer)
60 transistor of peripheral circuit (transistor)
70 contact electrode (first contact electrode, second contact electrode)
71 contact electrode (first contact electrode)
73, 74 contact electrode (second contact electrode)
80, 81 insulating film
90 silicide
100 display device
110 peripheral circuit (drive circuit)
120 pixel circuit (drive circuit)
300 television apparatus (electronic apparatus)
301 video display screen unit (display device)
400 digital camera (electronic apparatus)
420 display unit (display device)
500 notebook personal computer (electronic apparatus)
530 display unit (display device)
600 video camera (electronic apparatus)
640 display unit (display device)
700 mobile phone (electronic apparatus)
740 display (display device)
750 sub-display (display device)
800 head-mounted display (electronic apparatus)
810 one-eye display (display device)
ELP light-emitting portion
TRDrv drive transistor (transistor)
TRSig image signal writing transistor (transistor)
TREl_c_1 first light emission control transistor (transistor)
TREl_c_2 second light emission control transistor (transistor)

The invention claimed is:

1. A display device, comprising:
    a light-emitting portion; and
    a drive circuit comprising a pixel circuit and a peripheral circuit, wherein
    the pixel circuit is in a first silicon region,
    the peripheral circuit is in a second silicon region,
    the pixel circuit includes:
        at least one first transistor configured to drive the light-emitting portion; and
        a first contact electrode,
    the at least one first transistor includes a first diffusion layer and a second diffusion layer,
    an entire surface each of the first diffusion layer and the second diffusion layer includes a silicide non-formation region,
    the silicide non-formation region does not include silicide,
    an insulating film covers each of the first diffusion layer and the second diffusion layer in the silicide non-formation region,
    the first contact electrode is electrically connected to the first diffusion layer,
    the peripheral circuit includes at least one second transistor,
    the at least one second transistor includes a third diffusion layer and a fourth diffusion layer,
    an entire surface of each of the third diffusion layer and the fourth diffusion layer includes a silicide formation region, and
    the silicide formation region includes silicide and does not include the insulating film.

2. The display device according to claim 1, wherein
    the peripheral circuit further includes a second contact electrode, and
    the second contact electrode is electrically connected to the third diffusion layer.

3. The display device according to claim 1, wherein the first diffusion layer has a lower impurity concentration of a diffusion layer surface than the second diffusion layer.

4. The display device according to claim 1, wherein the first diffusion layer includes a deeper region than the second diffusion layer.

5. The display device according to claim 1, wherein the at least one first transistor including the first diffusion layer is connected to the light-emitting portion via the first contact electrode.

6. The display device according to claim 5, wherein the at least one first transistor is a drive transistor configured to operate as a current limiting element.

7. The display device according to claim 1, wherein the drive circuit further includes an image signal writing transistor configured to turn on or off a drive current flowing through the light-emitting portion.

8. The display device according to claim 1, wherein the light-emitting portion is an organic electroluminescent diode.

9. An electronic apparatus, comprising:
    a display device including:
        a light-emitting portion; and
        a drive circuit comprising a pixel circuit and a peripheral circuit, wherein
        the pixel circuit is in a first silicon region,
        the peripheral circuit is in a second silicon region,
        the pixel circuit includes:
            at least one first transistor configured to drive the light-emitting portion; and
            a contact electrode,
        the at least one first transistor includes a first diffusion layer and a second diffusion layer,
        an entire surface of each the first diffusion layer and the second diffusion layer includes a silicide non-formation region,
        the silicide non-formation region does not include silicide,
        an insulating film covers each of the first diffusion layer and the second diffusion layer in the silicide non-formation region,
        the contact electrode is electrically connected to the first diffusion layer,
        the peripheral circuit includes at least one second transistor,
        the at least one second transistor includes a third diffusion layer and a fourth diffusion layer,
        an entire surface of each of the third diffusion layer and the fourth diffusion layer includes a silicide formation region, and
        the silicide formation region includes silicide and does not include the insulating film.

* * * * *